United States Patent

Akram et al.

[11] Patent Number: 6,072,321
[45] Date of Patent: *Jun. 6, 2000

[54] MICROMACHINED SILICON PROBE CARD FOR SEMICONDUCTOR DICE AND METHOD OF FABRICATION

[75] Inventors: Salman Akram; David R. Hembree; Alan G. Wood, all of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/972,088

[22] Filed: Nov. 17, 1997

Related U.S. Application Data

[62] Division of application No. 08/625,281, Apr. 1, 1996, Pat. No. 5,869,974.

[51] Int. Cl.⁷ .................................................. G01R 31/02
[52] U.S. Cl. ........................ 324/754; 324/757; 324/765
[58] Field of Search .................................. 324/754, 755, 324/757, 758, 761, 765; 29/846, 852

[56] References Cited

U.S. PATENT DOCUMENTS

| | | | |
|---|---|---|---|
| 4,312,117 | 1/1982 | Robillard et al. | 29/589 |
| 4,585,991 | 4/1986 | Reid et al. | 324/158 P |
| 4,891,585 | 1/1990 | Janko et al. | 324/158 P |
| 4,906,920 | 3/1990 | Huff et al. | 324/158 P |
| 4,918,383 | 4/1990 | Huff et al. | 324/158 F |
| 5,006,792 | 4/1991 | Malhi et al. | 324/158 R |
| 5,072,116 | 12/1991 | Kawade et al. | 250/306 |
| 5,090,118 | 2/1992 | Kwon et al. | 29/843 |
| 5,124,639 | 6/1992 | Carlin et al. | 324/158 P |
| 5,172,050 | 12/1992 | Swapp | 324/158 P |
| 5,177,439 | 1/1993 | Liu et al. | 324/158 P |
| 5,180,977 | 1/1993 | Huff | 324/158 P |
| 5,225,037 | 7/1993 | Elder et al. | 156/644 |
| 5,241,266 | 8/1993 | Ahmad et al. | 324/158 R |
| 5,264,787 | 11/1993 | Woith et al. | 324/158 P |
| 5,279,975 | 1/1994 | Devereaux et al. | 437/8 |
| 5,323,035 | 6/1994 | Leedy | 257/750 |
| 5,389,885 | 2/1995 | Swart | 324/761 |
| 5,483,175 | 1/1996 | Ahmad et al. | 324/766 |
| 5,483,741 | 1/1996 | Akram et al. | 29/846 |
| 5,585,282 | 12/1996 | Wood et al. | 437/8 |
| 5,607,818 | 3/1997 | Akram et al. | |
| 5,625,298 | 4/1997 | Hirano et al. | 324/754 |
| 5,686,317 | 11/1997 | Akram et al. | 437/8 |
| 5,716,218 | 2/1998 | Farnworth et al. | |
| 5,869,974 | 2/1999 | Akram et al. | |

FOREIGN PATENT DOCUMENTS

| | | | |
|---|---|---|---|
| 3-691131 | 3/1991 | Japan | H01L 21/66 |

OTHER PUBLICATIONS

"Science Over Art. Our New IC Membrane Test Probe", Packard Hughes Interconnect advertising brochure, 1991. (Month Unavailable).

*Primary Examiner*—Josie Ballato
*Assistant Examiner*—Russell M. Kobert
*Attorney, Agent, or Firm*—Stephen A. Gratton

[57] ABSTRACT

A probe card for testing semiconductor dice contained on a wafer and a method for fabricating the probe card are provided. The probe card includes a substrate preferably formed of silicon, and having a pattern of contact members corresponding to a pattern of test pads on the wafer. Each contact member is formed integrally with the substrate and includes a projection formed as an elongated blade adapted to penetrate into a corresponding test pad to a limited penetration depth. In addition, a cavity and a flexible membrane are formed in the substrate subjacent to the contact members to permit flexure of the contact members. Fluid or gas pressure can be introduced into the cavity through flow passages formed in the substrate.

19 Claims, 4 Drawing Sheets

MICROMACHINED SILICON PROBE CARD FOR SEMICONDUCTOR DICE AND METHOD OF FABRICATION

CROSS REFERENCE TO RELATED APPLICATIONS

This application is a division of application Ser. No. 08/625,281 filed Apr. 1, 1996 now U.S. Pat No. 5,869,974.

FIELD OF THE INVENTION

This invention relates generally to testing of semiconductor dice and specifically to an improved micromachined silicon probe card for testing dice contained on a wafer and to a method for fabricating the probe card.

BACKGROUND OF THE INVENTION

A fabrication process for a semiconductor die begins with a semiconductor wafer on which a large number of semiconductor dice have been formed by doping, masking, deposition of metals, and etching a silicon substrate. Following the fabrication process the wafer is probed and mapped. Wafer probe is performed to test the gross functionality of the dice on the wafer. In addition, the nonfunctional dice are mechanically marked or mapped in software.

In the past semiconductor wafers have been probed utilizing needle probes formed on a probe card. The needle probes provide a temporary electrical connection between test pads on the dice and external test circuitry. The probe card typically includes an insulating substrate, such as a glass filled plastic, and the needle probes are soldered to openings in the substrate in electrical communication with circuit traces on the substrate.

One problem with this type of conventional probe card is that the planarity and vertical position of the needle probes can vary. Also the z-direction location of the test contacts on the wafer can vary. This can cause inaccuracies in the test results because electrical contact with the different test pads can vary. Continued use of the needle probes causes deformation and further misalignment of the needle probes. Probe cards with needle probes are thus expensive to fabricate and expensive to maintain. In addition, needle probes do not adequately compensate for vertical misalignment between the test pads on the wafer.

Another problem with needle probe cards is that the test pads on the wafer are typically coated with a metal oxide layer. For example, aluminum test pads can be covered with aluminum oxide that forms by oxidation of the underlying metal. This metal oxide is electrically non-conductive and provides a high degree of electrical resistance to the needle probes. In order to ensure accurate test results, the needle probes must penetrate this oxide layer to the underlying metal film. This requires high contact forces which can damage the test pads.

To overcome some of the problems associated with conventional needle probes, membrane probe cards have been developed. U.S. Pat. Nos. 4,891,585; 4,918,383; 4,906,920 and 5,180,977 disclose representative membrane probe cards. Membrane probe cards typically include a membrane formed of a thin and flexible dielectric material such as polyimide. Contact bumps are formed on the membrane in electrical communication with conductive traces. The conductive traces electrically connect to external test circuitry.

In general, membrane probes are able to compensate for vertical misalignment between the test pads on the wafer. In addition, the membrane probe can include a support mechanism that allows the contact bumps to scrub the surface of the test contacts on the wafer to penetrate the oxide layer.

Membrane probes are typically formed by plating a metal layer on a flexible dielectric surface and then patterning and etching the metal layer using photolithographic methods. The contact bumps can also be formed by plating or other deposition process. However, the manufacturing process for membrane probes is complex and expensive. In addition, the support mechanisms for membrane probes are also complicated and can require a large number of moving parts.

Another disadvantage of membrane probes is that large contact forces are required to make a reliable electrical connection between the contact bumps on the probe and the test pads on the wafer. These contact forces include a vertical "overdrive" force and a horizontal "scrubbing" force. These large forces can damage the test pads and the wafer. In addition, the contact bumps and membranes are repeatedly stressed by the large forces. These forces can cause the membrane to lose its resiliency.

In addition, an elastomeric member is typically formed between the membrane probe and the support mechanism to cushion the force applied by the membrane probe to the wafer. This elastomeric member can also be adversely affected by the large contact forces. High temperatures used during the test procedure can also compound this problem. It is well known that elastomeric materials exhibit a compression set or "creep" under stress. High temperatures and large contact forces increase creep in the elastomeric member and in the membrane of the probe.

In view of the foregoing problems associated with conventional probe cards for testing semiconductor dice, it is an object of the present invention to provide an improved probe card for testing semiconductor dice contained on a wafer.

It is another object of the present invention to provide an improved method for forming a probe card for testing semiconductor dice contained on a wafer.

It is yet another object of the present invention to provide an improved method for testing semiconductor dice contained on a wafer using a silicon micromachined probe card.

Other objects, advantages and capabilities of the present invention will become more apparent as the description proceeds.

SUMMARY OF THE INVENTION

In accordance with the present invention, an improved probe card for testing semiconductor dice contained on a wafer and a method for forming the probe-card are provided. The probe card includes a die test member mounted on a support member. The die test member is adapted to provide a temporary electrical connection with test pads for dice contained on the wafer. The die test member includes a substrate and a plurality of compliant contact members formed on the substrate in a pattern that corresponds to the test pads for the dice. The substrate is preferably silicon, or other semiconducting material, that can be etched and layered with conductive and insulating materials using semiconductor circuit fabrication techniques.

The contact members are formed over etched trenches in the substrate or alternately over a central cavity in the substrate. In either case, a flexible segment is formed on the substrate subjacent to the contact members that permits the contact members to flex in the z-direction to accommodate variations in the vertical location of the test pads. The dimensions of the flexible segment are controlled to provide a desired compliancy or spring constant for the contact members. Further compliancy control can be achieved by exerting air or fluid pressure on the trenches or cavity.

The contact members are overlaid with a conductive layer in electrical communication with conductive traces for conducting test signals to and from the contact members. The compliant contact members also include penetrating projections for penetrating the test pads for the die to a limited penetration depth. The penetrating projections are preferably formed as elongated blades that spread out the current density onto the test pads.

The probe card can be formed using semiconductor circuit fabrication techniques. In particular, bulk micromachining of silicon can be used to form the contact members, to form the penetrating projections, and to form the etched trenches or central cavity for the die test member. Growth and deposition processes for oxides and dielectrics can be used to electrically insulate and isolate the contact members. In addition, metallization processes can be used to form a conductive layer and conductive traces for the contact members.

During a test procedure using the probe card, the probe card is placed in electrical communication with test circuitry. An alignment window on the support member of the probe card permits the contact members to be aligned with the test pads for particular dice on the wafer. The wafer and probe card are then brought into contact so that the penetrating projections of the contact members penetrate into the test pads on the wafer to establish a temporary electrical connection for testing. The wafer, or the probe card, is then stepped to sequentially align and test each die on the wafer.

BRIEF DESCRIPTION OF THE DRAWINGS

FIG. 9CC is a schematic cross sectional view of an alternate embodiment penetrating projection formed using an isotropic etch process;

FIGS. 9EE–9FF are schematic cross sectional views illustrating steps in a method for forming the probe card of FIG. 1B in accordance with the invention;

BRIEF DESCRIPTION OF THE DRAWINGS

Figures 1A, 1B:
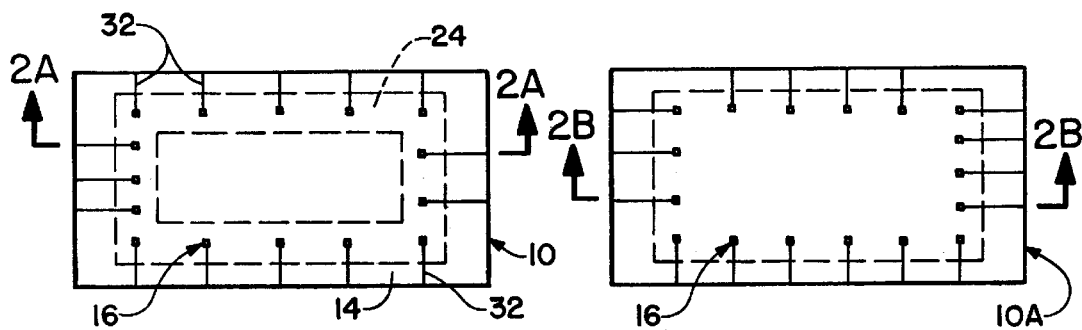
FIG. 1A is a top plan view of a die test member for a probe card constructed in accordance with the invention.
FIG. 1B is a top plan view of an alternate embodiment die test member.
Figures 2A, 2B:
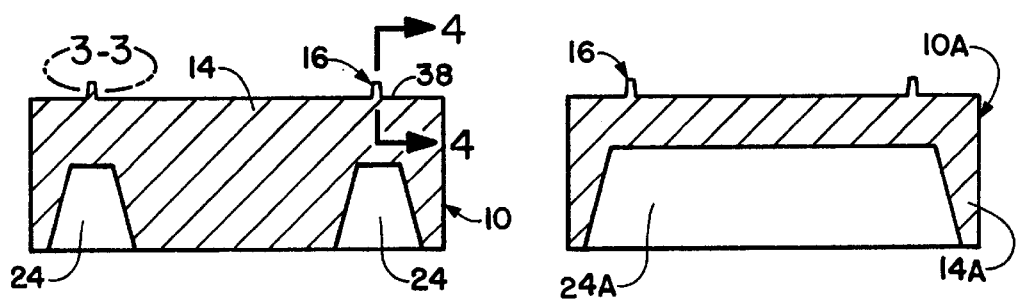
FIG. 2A is a cross sectional view taken along section line 2A—2A of FIG. 1A.
FIG. 2B is a cross sectional view taken along section line 2B—2B of FIG. 1B.
Figure 5:
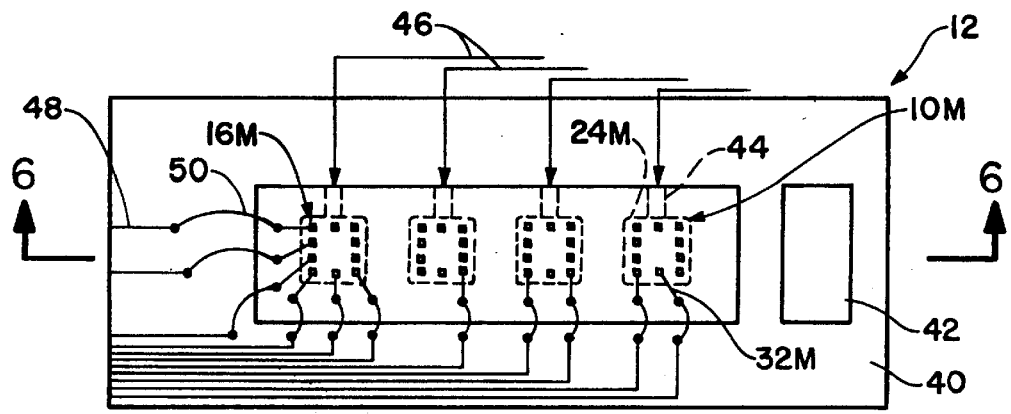
FIG. 5 is a top plan view of a probe card constructed in accordance with the invention.

Referring to FIGS. 1A and 2A, a test member 10 constructed in accordance with the invention is shown. As will be further explained, the test member 10 can be used to form a probe card 12 (FIG. 5).

Figure 7:
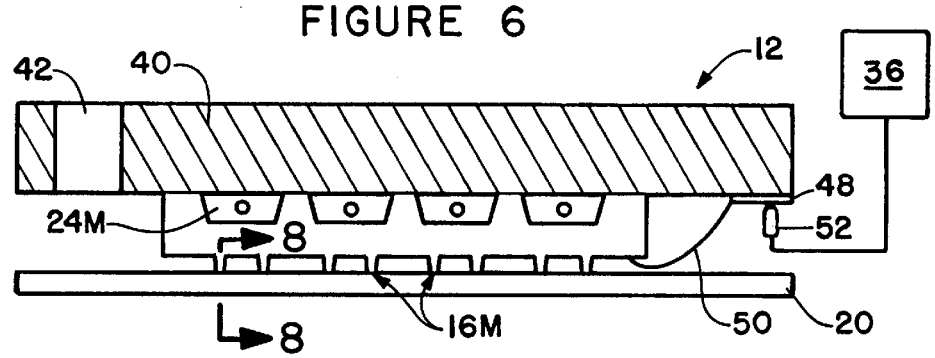
FIG. 7 is a schematic cross sectional view of a probe card constructed in accordance with the invention shown testing a semiconductor wafer.

The test member 10 is adapted to establish a temporary electrical connection with a semiconductor die 18 (FIG. 8) contained on a wafer 20 (FIG. 7). The test member 10 includes a substrate 14 and a plurality of contact members 16 formed on the substrate 14. The contact members 16 are formed in a pattern that corresponds to test pads 22 (FIG. 8) formed on the wafer 20. The test pads 22 will typically be the bond pads for the die 18 but can also be formed separately from the die 18 at different locations on the wafer 20 (see for example U.S. Pat. No. 5,279,975).

The test member 10 includes a pattern of grooves 24 formed in the substrate 14 proximate to the contact members 16. As will be further explained, the grooves 24 form flexible segments in the substrate 14 that allow the contact members 16 to flex or move in a z-direction during use. The substrate 14 is preferably formed of monocrystalline silicon and the grooves 24 are preferably formed in the substrate 14 using an etching process.

FIGS. 1B and 2B illustrate an alternate embodiment test member 10A wherein a central etched cavity 24A rather than a plurality of separate grooves 24 is provided. In this case only one flexible segment is formed for all of the contact members 16. The structure and function of the alternate embodiment test member 10A is otherwise substantially equivalent to test member 10.

Figure 3:
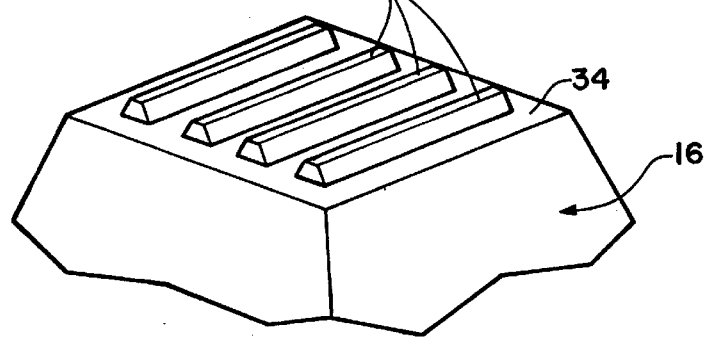
FIG. 3 is an enlarged perspective view taken along section line 3—3 of FIG. 2A.
Figure 4:
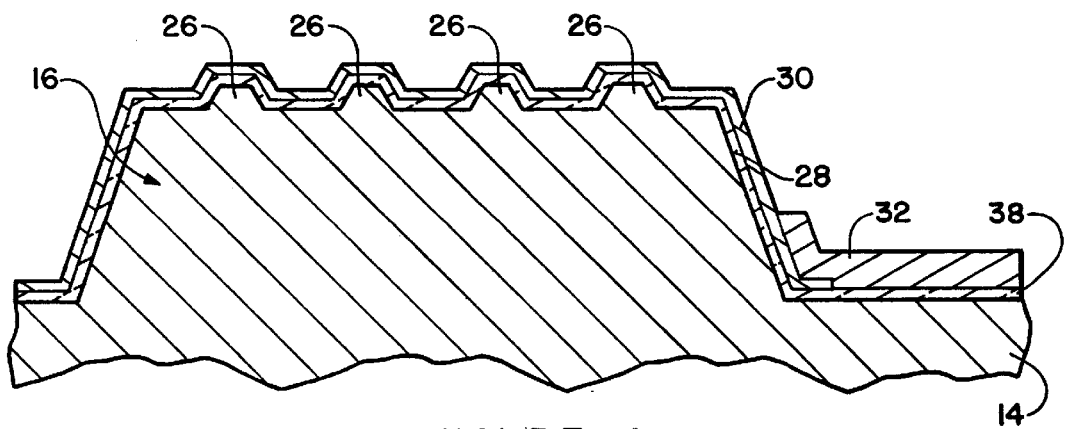
FIG. 4 is an enlarged cross sectional view taken along section line 4—4 of FIG. 2A.

Referring to FIGS. 3 and 4, a contact member 16 for the test member 10 (or 10A) is shown in greater detail. Each contact member 16 is raised from an upper surface 38 (FIG. 4) of the substrate 14. In addition, each contact member 16 includes one or more penetrating projections 26 adapted to penetrate into the test pads 22 (FIG. 8) on the wafer 20 to a self limiting penetration depth. As will be further explained, the contact members 16 and penetrating projections 26 can be formed integrally with the substrate 14 using an anisotropic etch formation process. With an anisotropic etch formation process, the contact members 16 and the penetrating projections 26 have a generally truncated pyramidal shaped cross section, with sloped sidewalls and a flat top portion.

As shown in FIG. 4, the contact members 16 also include an insulating layer 28 and a conductive layer 30. The insulating layer 28 covers the entire upper surface 38 of the substrate 14 to provide electrical insulation for the substrate 14. The conductive layer 30 is patterned to cover just the contact members 16 and can be formed as a metal, a metal silicide or a bi-metal stack.

The conductive layers 30 for the contact members 16 are in electrical communication with a pattern of conductors 32 formed on the substrate 14. As will be further explained, the conductors 32 can be formed on the insulating layer 28 using a metallization process. The conductors 32 provide an electrical path between the contact members 16 and test circuitry 36 (FIG. 7).

Figure 8:
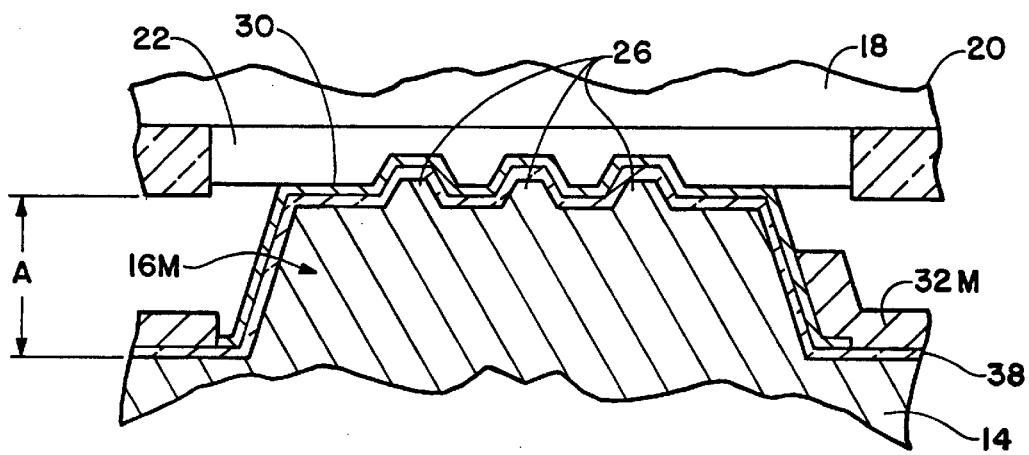
FIG. 8 is an enlarged cross sectional view taken along section line 8—8 of FIG. 7.

The height of the contact members 16 can be about 10–100 μm. As shown in FIG. 8, this height provides a separation distance "A" between the surface of the wafer 20 and the surface of the test member 10. This separation distance helps to raise the planar surfaces above particulate contaminants, and to eliminate cross talk between the probe card 12 and wafer 20. The spacing of adjacent contact members 16 matches the spacing of the test pads 22 (e.g., 50 µm–250 µm) on the wafer 20.

Each contact member 16 can include several penetrating projections 26 arranged in a desired pattern (e.g., rows, criss-cross, spoke, radial). In the illustrative embodiment, the penetrating projections 26 are formed as rows of parallel spaced elongated blades. Multiple elongated penetrating projections 26 provide a relatively large surface area for conducting electrical signals to the test pads 22. Although only one penetrating projection 26 is required, with multiple elongated projections 26, current density is spread out and not confined to a small area as can occur with a single pointed or conical member.

The height of each projection 26 is preferably about 1/10 to 3/4 the thickness of the test pads 22 (FIG. 8). The projections 26 will therefore not completely penetrate the full thickness of the test pads 22, as the upper surface 34 (FIG. 3) of the contact members 16 provides a stop plane to limit the penetration depth. In addition, the height of the projections 26 is selected to allow good electrical contact but at the same time to minimally damage the test pads 22. As an example, the height of each projection 26 measured from the surface 34 of the contact member 16 to the tip of the projection 26 can be about 100–10,000 Å. This compares to a representative thickness of the test pads 22 that is typically the same as a metal bond pad on the order of 2,000 to 15,000 Å.

Figure 6:
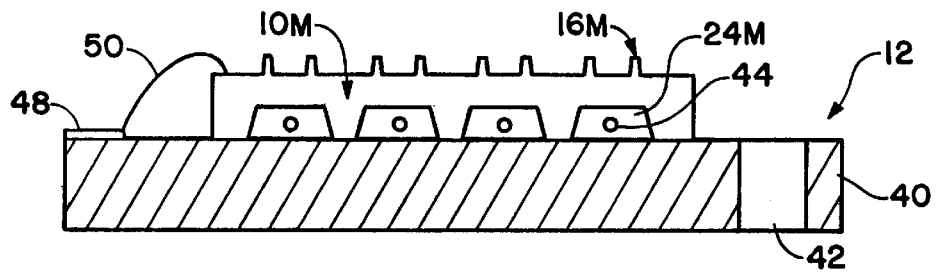
FIG. 6 is a cross sectional view taken along section line 6—6 of FIG. 5.

Referring to FIGS. 5 and 6, details of the probe card 12 are shown. The probe card 12 includes a test member 10M and a support member 40. The test member 10M is a monolithic structure substantially equivalent to the test member 10 previously described but adapted to simultaneously test four dice 18 at once. As such, the test member 10M includes four patterns of contact members 16M formed superjacent to four etched cavities 24M. Alternately, the test member 10M can be constructed to simultaneously test from one die to all of the dice on a wafer or an integral die multiple (e.g., 8, 16, 32).

In addition, the test member 10M includes a pattern of conductors 32M in electrical communication with the conductive layers for the contact members 16M substantially as previously described. The pattern of conductors 32M can be formed using a metallization process in a desired pattern and with bonding sites on a terminal end thereof.

The test member 10M also includes etched passageways 44 that are in flow communication with the cavities 24M. The etched passageways 44 are also in flow communication with conduits 46 formed of tubing or other suitable material sealingly attached to the test member 10M. The conduits 46 are in flow communication with a fluid or gas supply (not shown) such that a fluid or gas can be injected into the cavities 24M to produce a variable pressure. With this arrangement the flexure of the contact members 16M can be controlled and varied as required.

The test member 10M is sealingly attached to the support member 40 using an adhesive such as an elastomeric adhesive or other suitable adhesive. The support member 40 is a rigid plate preferably formed of a material such as silicon, or ceramic, that can withstand the high temperatures encountered during testing. The support member 40 includes an alignment window 42 that can be used to align the test members 16M with the test pads 22 (FIG. 8) on the wafer 20. During a test procedure using the probe card 12, the wafer 20 (FIG. 7) can be viewed through the alignment window 42 and then stepped as required to achieve alignment of the contact members 16M and test pads 22. Alternately, the wafer 20 can be held in a stationary position and the probe card 12 can be stepped as required.

The support member 40 of the probe 12 includes a pattern of conductors 48 on the surface thereof. The pattern of conductors 48 can be formed using a metallization process in a desired pattern and with bonding sites on a terminal end. The conductors 48 are connected to the conductors 32 (FIG. 8) on the test member 10M using a suitable interconnection technique. Such techniques can include solder joints, wire bonds, TAB tape, flex circuitry etc. By way of example bond wires 50 are shown.

As shown in FIG. 7, the conductors 48 can be contacted by pogo pins 52 or other electrical connectors in electrical communication with the test circuitry 36. This arrangement can be used to provide a conductive path from the test circuitry 36, through the conductors 48 on the support member 40, through the bond wires 50, through the conductors 32M on the test member 10, through the conductive layer 30 of the contact members 16M, and to the test pads 22 on the wafer 20.

Referring to FIGS. 7 and 8, a test procedure using the probe card 12 is illustrated. For the test procedure the probe card 12 is mounted to a conventional wafer probe apparatus (not shown) such as a wafer stepper manufactured by Electroglass and designated a Model 4080. The wafer probe apparatus includes a conductive path from the test circuitry 36 such as Teradyne Model 937 to the pogo pins 52. With the probe card 12 assembled on the wafer probe apparatus, the pogo pins 52 contact the conductors 48 on the support member 40. Other connection systems can also be used or applied.

The wafer probe apparatus is adapted to align the probe card 12 and wafer 20 and bring the contact members 16M into contact with the test pads 22 with a desired contact force. As shown in FIG. 8, the penetrating projections 26 of the contact members 16M penetrate into the test pads 22 on the die 18 to a self limiting penetration depth. This provides a temporary electrical connection between the test pads 22 and the contact members 16M. Test signals can be applied by the testing circuitry 36 to the integrated circuits formed within the die 18 using this temporary electrical connection. In addition, a separation distance "A" is maintained between the surface of the die 18 (or wafer 20) and the surface of the test member 10M. This separation distance is substantially equal to the height of the contact members 16M.

Figure 9A:
FIGS. 9A–9F are schematic cross sectional views illustrating steps in a method for forming the probe card of FIG. 1A in accordance with the invention.

Referring to FIGS. 9A–9F, a fabrication process for forming the test member 10 (FIG. 1A) is illustrated. Initially, as shown in FIG. 9A, the substrate 14 is formed of a material having a coefficient of thermal expansion (CTE) that closely matches the CTE of a silicon die. Suitable materials for the substrate 14 include monocrystalline silicon, silicon-on-glass, silicon-on-sapphire, germanium, and ceramic.

Figure 9B:

Next, as shown in FIG. 9B, a first etch mask 54 is formed on the substrate 14. The etch mask 54 can be formed of a material such as silicon nitride ($Si_3N_4$), by blanket depositing a layer of the material (e.g., CVD) followed by photopatterning and then etching (e.g., wet or dry etching). A typical thickness for the etch mask 54 is about 500 Å to 3000 Å. The etch mask 54 includes masking blocks 56 and openings therebetween. An etch mask 54 formed of silicon nitride can be etched with a pattern of openings using hot (e.g., 180° C.) phosphoric acid. A dry etch process with a suitable etchant species can also be used for this etch. Viewed from above, the masking blocks 56 can be rectangular blocks formed in a parallel spaced pattern.

Figure 9C:
Figure 9C:
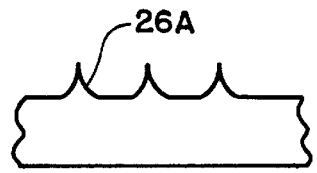

Next, as shown in FIG. 9C, the penetrating projections 26 are formed in the substrate 14 using the first etch mask 54 (FIG. 9B). The projections 26 can be etched in the substrate 14 using a wet or dry isotropic, or anisotropic, etch process. For a substrate 14 formed of silicon, a wet etchant such as a solution of KOH and $H_2O$ can be utilized to anisotropically etch the projections 26. This type of etching is also known in the art as bulk micro-machining. The projections have a generally pyramidaly shaped body with sloped sidewalls. The slope of the sidewalls is a function of the different etch rates of monocrystalline silicon along the different crystalline orientations. This etch angle is approximately 54° with the horizontal.

In place of an anisotropic etch, an isotropic etch can be used to form the penetrating projections 26 with radiused sidewalls (not shown). For an isotropic etch in which the etch rate is the same in all directions, an etchant solution containing a mixture of HF, $HNO_3$ and $H_2O$ can be utilized. This will result in the projections 26A (FIG. 9CC) having a pointed tip and a radiused sidewall contour (not shown). The sidewall contour is controlled by the etch parameters (i.e., time, temperature, concentration of etchant) and by the width of the masking blocks 32.

The placement and peripheral dimensions of the penetrating projections 26 corresponds to the placement and peripheral dimensions of the test pads 22 (FIG. 8) on the die 18. For example, bond pads on a die are typically polygonal shaped metal pads that are about 50–100 μm on a side and spaced apart by about 50–100 μm. Furthermore, a greater or lesser number of penetrating projections 26 can be used and other patterns than the parallel space pattern of penetrating projections 26 can be used (e.g., square pattern, cross pattern, telescoping pattern).

The height of each projection 26 is preferably about 1/10 to 3/4 the thickness of the test pads 22 (FIG. 8). The projections 26 will therefore not completely penetrate the full thickness of the test pads 22 and the surface 34 (FIG. 3) provides a stop plane for limiting further penetration of the projections 26. In addition, the height of the projections 26 is selected to allow good electrical contact but at the same time to minimally damage the test pads 22.

Following formation of the projections 26, the first etch mask 54 (FIG. 9B) is stripped. With the first etch mask 54 formed of silicon nitride, the mask can be stripped using a wet etchant such as $H_3PO_4$ that is selective to the substrate 14.

Figure 9D:
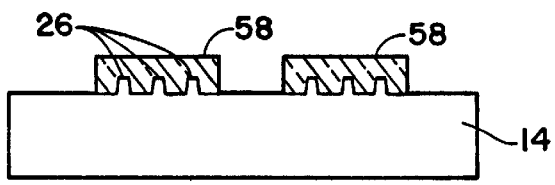

Next, as shown in FIG. 9D, a second etch mask 58 is formed over the projections 26. The second etch mask 58 can be formed as previously described out of a material such as silicon nitride ($Si_3N_4$) by blanket depositing the material (e.g., CVD) followed by photopatterning and then etching (e.g., wet or dry etch). The second etch mask 58 is then used to etch the substrate 14 to form the contact members 16. For an anisotropic etch, in which the etch rate is different in different directions, an etchant solution containing a mixture of KOH and $H_2O$ can be utilized. This results in the contact members 16 having sidewalls that are sloped at an angle of approximately 54° with the horizontal.

Figure 9E:
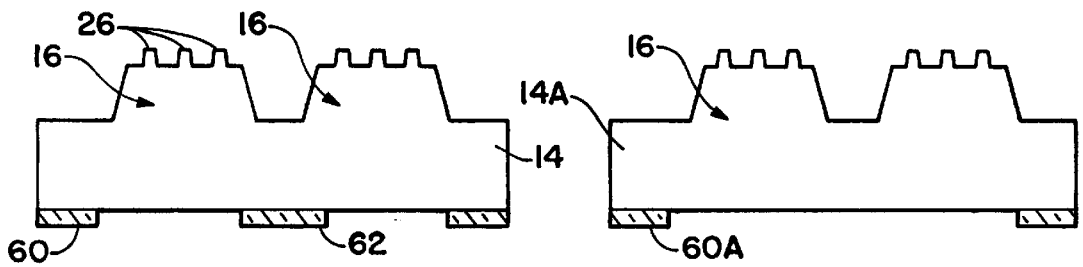
Figure 9F:
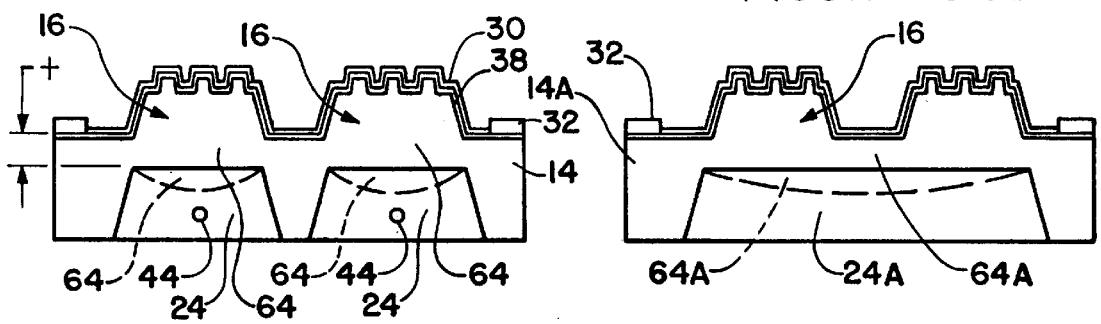

Next, as shown in FIG. 9E, the second etch mask 58 is stripped and a third etch mask 60 having masking blocks 62 is formed on the backside of the substrate 14. The etch mask 60 and masking blocks 62 can be formed of a material such as silicon nitride as previously explained. The etch mask 60 is used to etch the substrate 14 to form the etched grooves 24 (FIG. 9F). As before, either a wet or dry isotropic or anisotropic etch process can be used to etch the substrate 10 to form the grooves 24. At the same time that the etched grooves 24 are formed, the passageways 44 for the conduits 46 (FIG. 6) can be formed using a suitable etch mask (not shown). Alternately as shown in FIGS. 9EE and 9FF, the central cavity 24A can be formed using an etch mask 60A.

As is apparent this etch sequence is merely illustrative and can be reversed. In particular either the front side or the backside of the substrate 14 can be processed initially.

As shown in FIG. 9F, the etched grooves 24 can be formed subjacent to the contact members 16 to form a flexible membrane portion 64 (or 64A) which functions as a compliant member for the contact members 16. The membrane portion 64 (or 64A) can be formed with a thickness of (t) to achieve a desired amount of deflection and spring force (C) as the penetrating projections 26 are pressed into the test pads 22 with a certain force. The spring constant (C) produced by the membrane portion 64 is dependent on its dimensions and material. These parameters can be related by the formula:

$$C = Ewt^3/4l^3$$

where C is the spring constant w is the width of the membrane portion t is the thickness of the membrane portion l is the length of the membrane portion E is the modulus of elasticity of the substrate Following the formation of the contact members 16, the insulating layer 28 is formed over the contact members 16 and substrate 14. The insulating layer 28 can be formed by oxidation of the substrate 10 such as by exposing the substrate 14 to an oxidizing atmosphere in a reaction chamber. Alternately, silicon dioxide can be deposited using plasma CVD techniques. Here TEOS (tetraethylorthosilane) can be injected into a reaction chamber to grow silicon dioxide ($SiO_2$) at a temperature of about 400° C. Another commonly used insulator suitable for this purpose is $Si_3N_4$. A representative thickness for the insulating layer 28 is from about 500 Å to 6000 Å.

As also shown in FIG. 9F, the conductive layer 30 is formed on top of the insulating layer 28 and over the contact members 16. The conductive layer 30 is preferably a highly conductive metal such as aluminum that can be deposited and patterned as required. By way of example, the conductive layer 30 can deposited using a process such as CVD, to a thickness of about 600 Å–3 μm and then photopatterned and etched to cover just the contact members 16 and penetrating projections 26.

One method for forming the conductive layer 30 is by electrophoretic deposition of a layer of photoresist followed by etching as disclosed in U.S. patent application Ser. No. 08/452,798 now U.S. Pat. No. 5,607,818, incorporated herein by reference. The conductive layer 30 can also be formed as a metal silicide as disclosed in U.S. Pat. No. 5,483,741, incorporated herein by reference. In addition, the conductive layer 30 can be formed as a bi-metal stack as disclosed in U.S. patent application Ser. No. 08/387,687 now U.S. Pat. No. 5,686,317, incorporated herein by reference.

The conductors 32 are formed on the substrate 14 in electrical communication with the conductive layer 30 for each contact member 16. The conductors 32 can be formed of a same material as the conductive layer 30 using the same deposition and patterning process or alternately out of a same or different material and a subsequent deposition and patterning process. The conductors 32 terminate in bonding sites (not shown) that allow the conductors 32 to be electrically connected to the support member 40 using bond wires 50 (FIG. 5) as previously described.

Figure 10A:
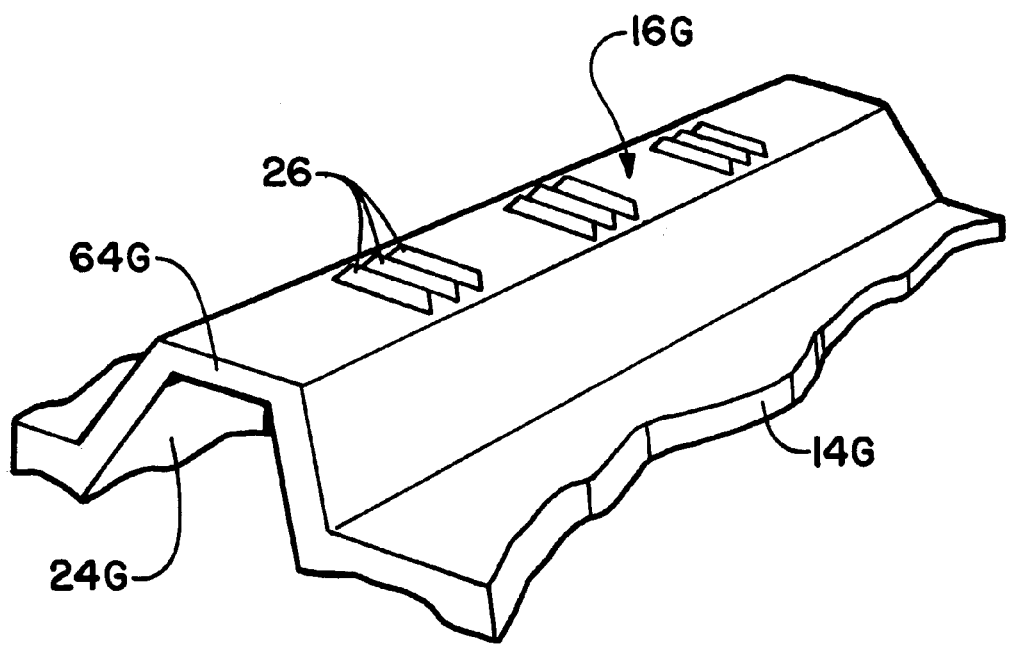
FIG. 10A is a schematic perspective view illustrating a contact member of an alternate embodiment probe card.
Figure 10B:
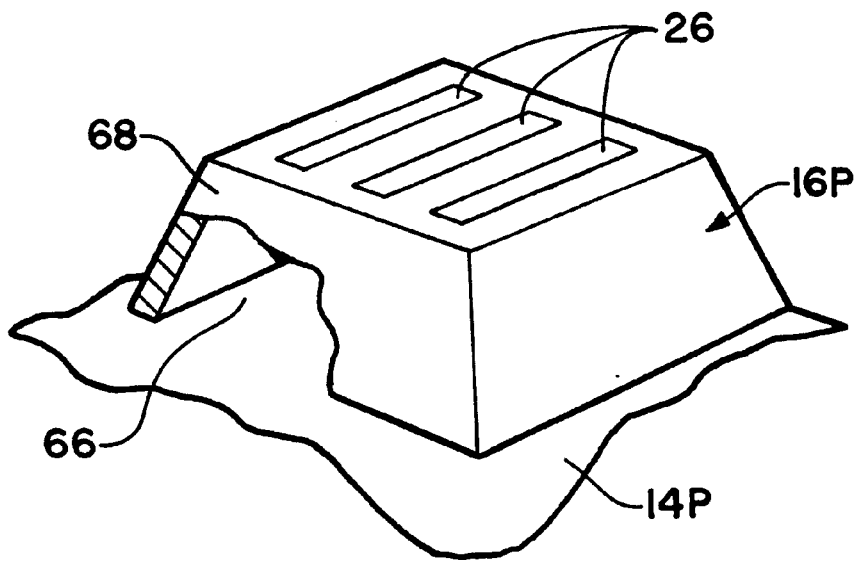
FIG. 10B is a schematic perspective view illustrating a contact member of another alternate embodiment probe card.

Referring to FIGS. 10A and 10B, alternate embodiment contact members 16G and 16P are shown. In FIG. 10A a contact member 16G includes a groove 24G etched into substrate 14B and extending into the pyramidal body of the contact member 16G. In this embodiment, a thin flexible membrane 64G is formed and the penetrating projections 26 are formed directly on the thin flexible membrane 64G. In FIG. 10B, a contact member 16P includes a pocket 66 etched into the substrate 14P that extends into the pyramidal body 68 of the contact member 16P. In this embodiment each contact member 16P is an independent compliant member.

While the invention has been described with reference to certain preferred embodiments, as will be apparent to those skilled in the art, certain changes and modifications can be made without departing from the scope of the invention as defined by the following claims.

What is claimed is:

1. A method for fabricating a probe card for testing a semiconductor wafer comprising;

providing a substrate;

forming a raised contact member on the substrate comprising a surface;

forming a projection on the raised contact member configured to penetrate a pad on the wafer to a limited penetration depth while the surface limits further penetration and separates the substrate and the wafer;

forming a conductive layer on the contact member and the projection;

forming a cavity in the substrate proximate to the contact member such that a portion of the substrate between the contact member and the cavity comprises a flexible membrane configured to permit flexure of the contact member during the testing of the wafer; and injecting a gas or a fluid into the cavity for applying a pressure to the membrane.

2. The method of claim 1 further comprising forming a passageway in the substrate configured for injecting the gas or the fluid into the cavity.

3. The method of claim 1 further comprising forming the flexible membrane with a thickness selected to control an amount of deflection of the contact member during the testing of the wafer.

4. The method of claim 1 further comprising forming the flexible membrane with a thickness, a length, and a material selected to control an amount of deflection of the contact member during the testing of the wafer.

5. The method of claim 1 wherein the substrate comprises silicon and further comprising forming an insulating layer on the substrate for electrically insulating the conductive layer.

6. The method of claim 1 further comprising forming the flexible membrane with a desired spring constant by selection of a thickness, a length and a material of the flexible membrane.

7. The method of claim 1 further comprising forming a plurality of contact members on the substrate and a plurality of cavities in the substrate proximate to the contact members.

8. A method for fabricating a probe card for testing a semiconductor wafer comprising;

providing a substrate;

forming a plurality of first contacts on the substrate configured to electrically contact a plurality of second contacts on the wafer;

forming a cavity in the substrate proximate to the first contacts and a flexible membrane comprising a portion of the substrate between the first contacts and the cavity, the flexible membrane having a thickness selected to permit flexure of the first contacts during the testing of the wafer; and injecting a gas or a fluid into the cavity for applying a variable pressure to the membrane.

9. The method of claim 8 wherein the substrate comprises silicon and forming the first contacts comprises etching the substrate.

10. The method of claim 8 further comprising forming a passageway in the substrate in flow communication with the cavity configured to introduce the gas or the fluid.

11. The method of claim 8 further comprising attaching the substrate to a rigid support member configured to mount the probe card to a wafer probe apparatus.

12. The method of claim 8 wherein the first contacts comprise projections configured to penetrate the second contacts while surfaces of the first contacts limit further penetration and separate the wafer and the substrate.

13. The method of claim 8 wherein the flexible membrane has a spring constant selected to control deflections of the first contacts during the testing of the wafer.

14. The method of claim 8 further comprising forming a plurality of cavities and a plurality of flexible membranes for the first contacts.

15. A method for fabricating a probe card for testing a semiconductor wafer comprising;

providing a substrate;

forming a plurality of first contacts on the substrate configured to electrically contact a plurality of second contacts on the wafer;

forming a cavity in the substrate proximate to the first contacts such that a portion of the substrate between the first contacts and the cavity comprises a flexible membrane configured to permit flexure of the first contacts during the testing of the wafer;

controlling the forming of the first contacts such that the flexible membrane has a thickness selected to control deflections of the first contacts such that the first contacts can accommodate variations in locations of the second contacts during the testing of the wafer; and injecting a gas or a fluid into the cavity for applying a variable pressure to the membrane.

16. The method of claim 15 wherein the deflections and the variations are in a z-direction.

17. The method of claim 15 wherein the substrate comprises silicon and forming the first contacts and the cavity comprise etching the substrate.

18. A method for fabricating a probe card for testing a semiconductor wafer comprising;

providing a substrate comprising silicon;

etching a cavity in the substrate to form a membrane comprising a portion of the substrate having a thickness and a length selected to provide a flexure of the membrane;

forming a plurality of first contacts on the membrane configured to electrically contact a plurality of second contacts on the wafer, the first contacts configured to deflect in a z-direction with the membrane during the testing of the wafer to accommodate variations in locations of the second contacts; and injecting a gas or a fluid into the cavity for varying the flexure.

19. The method of claim 18 wherein the first contacts comprise projections configured to penetrate the second contacts to a limited penetration depth.

\* \* \* \* \*